United States Patent
Lyons et al.

(10) Patent No.: US 9,302,291 B2
(45) Date of Patent: Apr. 5, 2016

(54) SYSTEMS AND METHODS FOR PROCESSING VAPOR

(75) Inventors: Christopher S. Lyons, St. Paul, MN (US); Kent T. Engle, Hudson, WI (US); Steven R. Vanhoose, Stillwater, MN (US); Terence D. Spawn, Stillwater, MN (US); Joseph M. Pieper, Minneapolis, MN (US); Edward J. Anderson, Somerset, WI (US); Walter Stoss, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/232,671

(22) PCT Filed: Aug. 1, 2012

(86) PCT No.: PCT/US2012/049146
§ 371 (c)(1),
(2), (4) Date: Jan. 14, 2014

(87) PCT Pub. No.: WO2013/022669
PCT Pub. Date: Feb. 14, 2013

(65) Prior Publication Data
US 2014/0178567 A1    Jun. 26, 2014

Related U.S. Application Data

(60) Provisional application No. 61/515,399, filed on Aug. 5, 2011.

(51) Int. Cl.
*B05D 1/00* (2006.01)
*C23C 14/12* (2006.01)
(Continued)

(52) U.S. Cl.
CPC . *B05D 1/60* (2013.01); *C23C 14/12* (2013.01); *C23C 14/228* (2013.01); *C23C 14/24* (2013.01); *C23C 14/544* (2013.01); *C23C 14/562* (2013.01); *C23C 14/58* (2013.01); *C23C 14/582* (2013.01); *C23C 14/5806* (2013.01)

(58) Field of Classification Search
None
See application file for complete search history.

(56) References Cited

U.S. PATENT DOCUMENTS

| 4,647,818 A | 3/1987 | Ham |
| 4,696,719 A | 9/1987 | Bischoff |

(Continued)

FOREIGN PATENT DOCUMENTS

| CN | 2119428 | 10/1992 |
| CN | 101092690 | 12/2007 |

(Continued)

OTHER PUBLICATIONS

PCT International Search Report from PCT/US2012/049146 mailed on Feb. 19, 2013, 4 pages.

*Primary Examiner* — Joseph Miller, Jr.
(74) *Attorney, Agent, or Firm* — Yufeng Dong (57) ABSTRACT

A system for processing vapor. The system includes a vapor source for producing a vapor and an outlet conduit coupled to the vapor source for carrying the vapor from the vapor source. Downstream of the vapor source the outlet conduit separates into a vapor bypass conduit and a vapor feed conduit. The system further includes a first vapor control valve disposed in the bypass conduit, a second vapor control valve disposed in the feed conduit, a first vacuum chamber connected to the bypass conduit, and a second vacuum chamber connected to the feed conduit.

11 Claims, 2 Drawing Sheets

(51) Int. Cl.
  *C23C 14/22* (2006.01)
  *C23C 14/24* (2006.01)
  *C23C 14/56* (2006.01)
  *C23C 14/58* (2006.01)
  *C23C 14/54* (2006.01)

(56) References Cited

U.S. PATENT DOCUMENTS

| | | | |
|---|---|---|---|
| 4,842,893 A | 6/1989 | Yializis et al. |
| 4,954,371 A | 9/1990 | Yializis |
| 5,018,048 A | 5/1991 | Shaw et al. |
| 5,032,461 A | 7/1991 | Shaw et al. |
| 5,090,985 A | 2/1992 | Soubeyrand |
| 5,356,451 A | 10/1994 | Cain et al. |
| 5,431,736 A | 7/1995 | Boer et al. |
| 5,440,446 A | 8/1995 | Shaw et al. |
| 5,536,323 A | 7/1996 | Kirlin et al. |
| 5,558,687 A | 9/1996 | Cain et al. |
| 5,595,603 A | 1/1997 | Klinedinst et al. |
| 5,632,797 A | 5/1997 | Williams |
| 5,653,813 A | 8/1997 | Benzing et al. |
| 5,725,909 A | 3/1998 | Shaw et al. |
| 5,811,183 A | 9/1998 | Shaw et al. |
| 5,877,895 A | 3/1999 | Shaw et al. |
| 5,938,853 A | 8/1999 | Williams |
| 5,951,923 A | 9/1999 | Horie et al. |
| 5,958,510 A | 9/1999 | Sivaramakrishnam et al. |
| 6,089,548 A | 7/2000 | Pfitzner et al. |
| 6,157,774 A | 12/2000 | Komino et al. |
| 6,172,810 B1 | 1/2001 | Fleming et al. |
| 6,231,939 B1 | 5/2001 | Shaw et al. |
| 6,245,150 B1 | 6/2001 | Lyons et al. |
| 6,309,508 B1 | 10/2001 | Lemme et al. |
| 6,357,880 B2 | 3/2002 | Epstein et al. |
| 6,409,839 B1 | 6/2002 | Sun et al. |
| 6,420,003 B2 | 7/2002 | Shaw et al. |
| 6,488,985 B1 | 12/2002 | Honda et al. |
| 6,815,043 B2 | 11/2004 | Fleming et al. |
| 6,818,291 B2 | 11/2004 | Funkenbusch et al. |
| 6,827,974 B2 | 12/2004 | Nelson |
| 6,887,346 B2 | 5/2005 | Lemme et al. |
| 6,929,864 B2 | 8/2005 | Fleming et al. |
| 6,958,107 B1 | 10/2005 | Clarke et al. |
| 7,018,713 B2 | 3/2006 | Padiyath et al. |
| 7,112,351 B2 | 9/2006 | Affinito |
| 7,300,538 B2 | 11/2007 | Lemme et al. |
| 7,449,146 B2 | 11/2008 | Rakow et al. |
| 7,596,305 B2 | 9/2009 | Nelson |
| 2001/0039921 A1* | 11/2001 | Rolfson ............... C23C 16/4412 118/715 |
| 2002/0022156 A1 | 2/2002 | Bright |
| 2003/0072875 A1 | 4/2003 | Sandhu |
| 2003/0124392 A1 | 7/2003 | Bright |
| 2003/0219528 A1 | 11/2003 | Carpenter et al. |
| 2004/0099635 A1 | 5/2004 | Nishikawa |
| 2004/0118342 A1 | 6/2004 | Cheng et al. |
| 2004/0159003 A1* | 8/2004 | Kolb et al. ....................... 34/114 |
| 2004/0202708 A1 | 10/2004 | Roehrig et al. |
| 2005/0037218 A1 | 2/2005 | Lottes et al. |
| 2005/0274323 A1* | 12/2005 | Seidel et al. .................. 118/719 |
| 2006/0078700 A1 | 4/2006 | Blestos et al. |
| 2006/0090702 A1* | 5/2006 | Koo ...................... C23C 16/409 118/719 |
| 2007/0120275 A1 | 5/2007 | Liu |
| 2007/0166528 A1* | 7/2007 | Barnes et al. ............... 428/304.4 |
| 2008/0017110 A1 | 1/2008 | Kim et al. |
| 2008/0108180 A1 | 5/2008 | Charles et al. |
| 2008/0292810 A1 | 11/2008 | Anderson et al. |
| 2010/0192854 A1 | 8/2010 | Nishino et al. |
| 2010/0275844 A1* | 11/2010 | Kim et al. ..................... 118/715 |
| 2011/0100554 A1* | 5/2011 | Carlson ................... C23C 16/44 156/345.29 |
| 2011/0104896 A1 | 5/2011 | Harada et al. |

FOREIGN PATENT DOCUMENTS

| | | |
|---|---|---|
| CN | 101573468 | 11/2009 |
| EP | 1643004 | 4/2006 |
| JP | 2004047895 A | 2/2004 |
| JP | 2005045158 A | 2/2005 |
| WO | WO 2008/083310 A1 | 7/2008 |

\* cited by examiner

SYSTEMS AND METHODS FOR PROCESSING VAPOR

CROSS REFERENCE TO RELATED APPLICATIONS

This application is a national stage filing under 35 U.S.C. 371 of PCT/US2012/049146, filed Aug. 1, 2012, which claims priority to U.S. Provisional Application No. 61/515,399 filed Aug. 5, 2011, the disclosure of which is incorporated by reference in its entirety herein.

FIELD

The present disclosure relates to systems and methods for processing vapor and, particularly, to systems and methods for monitoring and controlling a flow of vapor generated by a vapor source.

BACKGROUND

Vapor coating techniques such as plasma deposition and chemical vapor deposition are used to deposit thin coatings of various materials without the use of solvents. Processes for coating organic materials onto a substrate (e.g., polymerizable or curable materials) by condensing a vapor containing such a material onto a substrate (e.g., a polymer film) and polymerizing and/or curing the condensed material are known, e.g., U.S. Pat. No. 4,842,893. These processes can involve the evaporation of organic or organometallic precursors to create a vapor that is transferred to the substrate to be coated. Some patents related to evaporation methods and apparatus are U.S. Pat. Nos. 6,309,508 and 7,112,351.

SUMMARY

In a first aspect, a system for processing vapor is provided. The system may include a vapor source for producing a vapor and an outlet conduit coupled to the vapor source for carrying the vapor from the vapor source. Downstream of the vapor source the outlet conduit may separate into a vapor bypass conduit and a vapor feed conduit. The system may further include a first vapor control valve disposed in the bypass conduit, a second vapor control valve disposed in the feed conduit, a first vacuum chamber fluidically coupled to the bypass conduit, and a second vacuum chamber fluidically coupled to the feed conduit.

In another aspect, a method for processing vapor is provided. The method may include discharging a vapor from a vapor source into a fluid pathway. The fluid pathway may include an outlet conduit fluidically coupled to the vapor source. Downstream of the vapor source the outlet conduit may separate into a vapor bypass conduit and a vapor feed conduit. The fluid pathway may further include a first vapor control valve disposed in the bypass conduit and a second vapor control valve disposed in the feed conduit, a first vacuum chamber fluidically coupled to the bypass conduit, and a second vacuum chamber fluidically coupled to the feed conduit. The method may further include controlling an amount of vapor passing through the feed conduit and the bypass conduit via manipulation of either or both of the first vapor control valve and the second vapor control valve.

The above summary of the present disclosure is not intended to describe each embodiment of the present invention. The details of one or more embodiments of the disclosure are also set forth in the description below. Other features, objects, and advantages of the invention will be apparent from the description and from the claims.

BRIEF DESCRIPTION OF THE DRAWINGS

The disclosure may be more completely understood in consideration of the following detailed description of various embodiments of the disclosure in connection with the accompanying figures, in which.

DETAILED DESCRIPTION

Vapor coating techniques such as, for example, chemical vapor deposition (CVD), plasma deposition, and polymer multi-layer deposition are used to deposit thin coatings of various materials on a substrate without the use of solvents. Often times, these techniques require the evaporation of a material (e.g., an organic, organometallic, or metal) to create a vapor flow to a deposition appliance (e.g., nozzle), which is positioned proximate the substrate to be coated.

Current evaporation processes utilized in such vapor coating techniques are known to produce unstable and variable evaporation rates over time. Moreover, in current vapor coating systems, the rate of deposition onto the substrate is a function of the rate of evaporation. Consequently, instability in evaporation rates leads to variation over time in deposition rate and, in turn, coating thickness.

The present disclosure relates to systems and methods for monitoring and controlling the characteristics of a vapor flow produced by a vapor source (e.g., an evaporator). In some embodiments, the systems and methods may involve monitoring and controlling a flow of vapor generated by a vapor source, which is to be deposited as a coating onto a substrate in a vapor coating chamber, such that a rate of vapor production in the vapor source (e.g., evaporation rate) is decoupled from a deposition rate of the vapor in the vapor coating chamber. In this manner, the systems and methods of the present disclosure may account for perturbations in vapor flow caused by variable vapor generation rates, thereby enabling precise control of vapor deposition rates and coating thickness.

As used in this specification and the appended embodiments, the singular forms "a", "an", and "the" include plural referents unless the content clearly dictates otherwise.

As used in this specification and the appended embodiments, the term "or" is generally employed in its sense including "and/or" unless the content clearly dictates otherwise.

As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Figure 1:
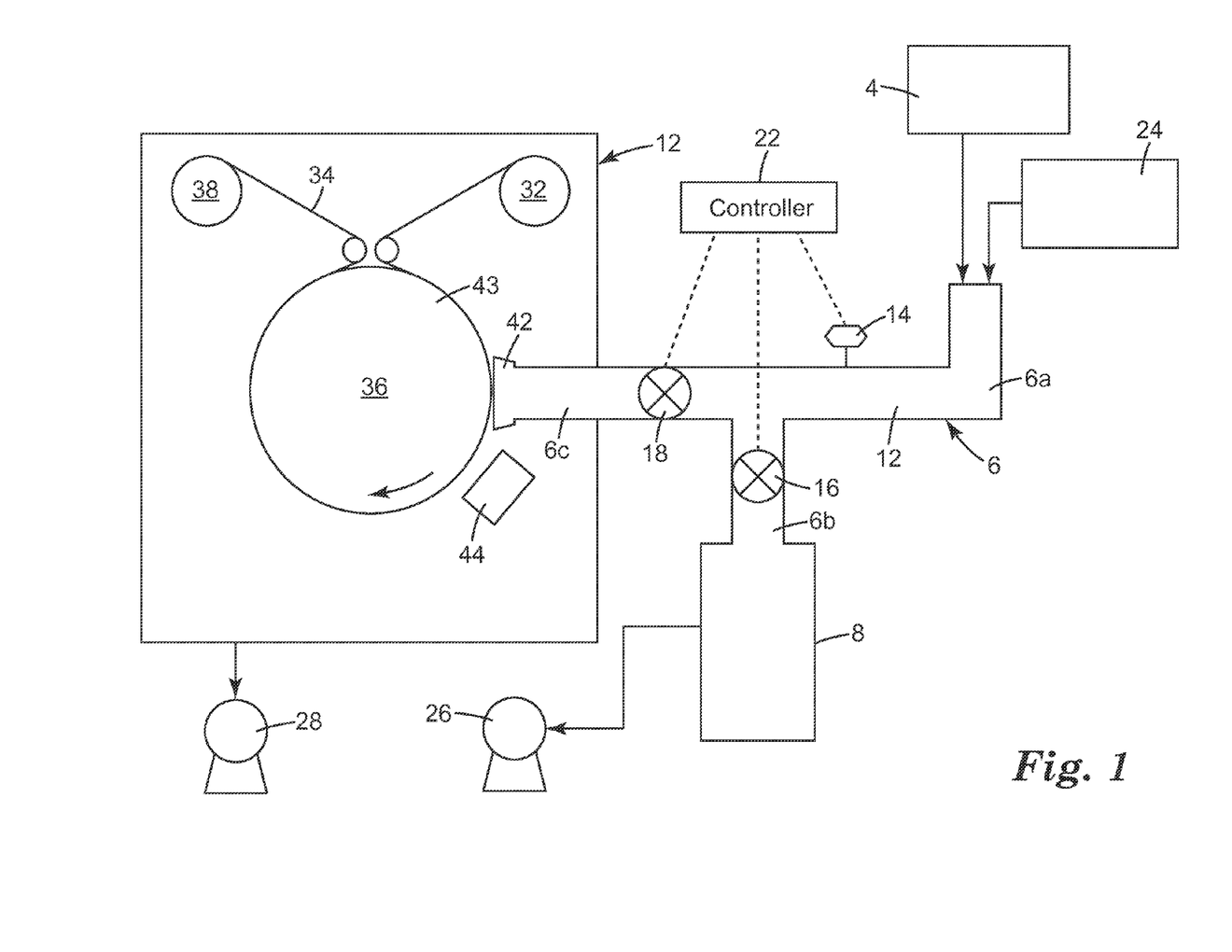
FIG. 1 illustrates a schematic diagram of a system for processing vapor in accordance with some embodiments of the present disclosure.

FIG. 1 illustrates a schematic diagram of a system 2 for processing vapor in accordance with some embodiments of the present disclosure. The system may include a vapor source 4 fluidically coupled, via a fluid pathway 6, to a first vacuum chamber 8 and a second vacuum chamber 12. The fluid pathway 6 may include an outlet conduit 6a, a vapor bypass conduit 6b, and a vapor feed conduit 6c. A pressure sensor 14 may be operatively coupled to the fluid pathway 6. A vapor bypass control valve 16 and a vapor feed control valve 18 may be disposed in the vapor bypass conduit 6b and the vapor feed conduit 6c, respectively. The system may further include a controller 22 operatively coupled to the pressure sensor 14 and either or both of the bypass vapor control valve 16 and the feed vapor control valve 18.

In some embodiments, the vapor source 4 may be configured as any device capable of vaporizing liquid. Suitable vapor sources may include, for example, heated baths, bubblers, atomizers, cyclone evaporators, ultrasonic evaporators, wiped-film evaporators, rolled film evaporators, spinning disk evaporators, rotary evaporators, porous frit evaporators, tubular evaporators, and the like. In various embodiments, the vapor source 4 may include one or more of the vapor sources described in the following patents and publications, incorporated by reference herein in their entireties: U.S. Pub. No. 2008/0108180 (Charles, et al.); U.S. Pub. No. 2008/0292810 (Anderson, et al.); U.S. Pat. No. 7,300,538 (Lemme et al.); U.S. Pat. No. 6,245,150 (Lyons et al.); U.S. Pat. No. 4,954,371 (Yializis et al.); U.S. Pat. No. 5,653,813 (Benzing et al.); U.S. Pat. No. 5,595,603 (Klinedinst et al.); U.S. Pat. No. 5,536,323 (Kirlin et al.); U.S. Pat. No. 5,431,736 (Boer et al.); U.S. Pat. No. 5,356,451 (Cain et al.); U.S. Pat. No. 5,558,687 (Cain et al.); U.S. Pat. No. 5,951,923 (Horie et al.); U.S. Pub. No. 2008/0017110 (Kim et al.); U.S. Pub. No. 2007/0120275 (Liu et al.); U.S. Pat. No. 6,089,548 (Plitzner et al.); U.S. Pat. No. 6,157,774 (Komino et al.); U.S. Pat. No. 6,958,107 (Clarke et al.); U.S. Pat. No. 6,409,839 (Sun et al.); and U.S. Pat. No. 6,488,985 (Honda et al.). While the present disclosure is described with respect to a single vapor source 4, it is to be appreciated that any number of additional vapor sources may be utilized. For example, a plurality of vapor sources 4 may be useful in embodiments in which a vapor mixture is desired and vaporization of two or more components of the vapor mixture in a single vapor source is difficult or impracticable (e.g., due to varying vapor pressure curves, immiscibility of the components in a liquid state, or undesirable reactions of components in liquid state).

In illustrative embodiments, the vapor supplied by the vapor source 4 may include monomers, oligomers, resins, waxes, solvents, organic compounds, organometallic compounds, metallic compounds, biologically active materials, and combinations thereof. Other suitable materials for vaporization include, but are not limited to, epoxies, vinyl ethers, (meth)acrylates, fluoro-containing polymers, styrene containing polymers, acetylenes, polyamides, acrylamides, parylenes, waxes, fluoropolyethers, polyamines, diallyl-diphenylsilanes, metal alkoxides, metal alkyls, silicones, oils, dyes, proteins, peptides, polypeptides, lipids, carbohydrates, enzymes, nucleic acids, polynucleic acids, drugs, drug metabolites, and combinations thereof.

In various embodiments, the vapor supplied by the vapor source 4 (and/or liquids or solids supplied as inputs to the vapor source 4) may include one or more additives to affect processing of the vapor and/or the properties and performance of a condensed or deposited material formed from the vapor, as is known in the art. For example, one or more additives may be included to lower surface tension, reduce viscosity, inhibit thermally-induced reactions such as polymerization, prevent oxidation reactions, or combinations thereof. To impart desirable properties in a condensed or deposited material formed from the vapor supplied by the vapor source 4, one or more additives may be included to absorb radiation (e.g., UV, visible wavelengths, IR, and microwave energy) and/or initiate reactions (e.g., photoinitiators, thermal initiators, and the like). Other additives may include colorants, crosslinkers, or other materials known in the art.

In some embodiments, combination of one or more reactive and/or non-reactive gases with the vapor generated by the vapor source 4 may be appropriate. In this regard, the system 2 may include a gas source 24 configured to provide a flow of gas to the vapor source 4 and/or the flow pathway 6. Suitable inert gases may include nitrogen, argon, helium, neon, and combinations thereof. Suitable reactive gases may include oxygen, ozone, nitrous oxide, hydrogen, hydrogen sulfide, carbon tetrafluoride, methane, ammonia, and combinations thereof.

In various embodiments, the vapor source 4 (and optionally the gas source 24) may be fluidically coupled to a fluid pathway 6. The fluid pathway 6 may include an outlet conduit 6a, which is fluidically coupled on a first end to the vapor source 4, and which is bifurcated on a second end to separate flow from the outlet conduit 6a into a vapor bypass conduit 6b and a vapor feed conduit 6c. The vapor bypass conduit 6b may terminate in a fluidic coupling to the first vacuum chamber 8. The vapor feed conduit 6c may terminate in a fluidic coupling to the second vacuum chamber 12.

In some embodiments, one or more pressure sensors may be operatively associated with the fluid pathway 6. The pressure sensors may be positioned and configured to sense a pressure of fluid being transported through the fluid pathway 6. For example, the system 2 may include a pressure sensor 14 positioned to sense the pressure of fluid being transported through the outlet conduit 6a. Additionally, or alternatively, the system may include pressure sensors positioned in either or both of the vapor bypass conduit 6b and feed conduit 6c, for example, downstream of the vapor bypass control valve 16 and the vapor feed control valve 18, respectively.

In some embodiments, a bypass vapor control valve 16 and a feed vapor control valve 18 may be disposed in the vapor bypass conduit 6b and the vapor feed conduit 6c, respectively. Generally, the valves 16, 18 may be configured as any devices capable of fully or partially opening or closing such that one or more properties (e.g., rate, pressure) of a fluid flow passing therethrough may be adjusted. The degree to which the valves are opened/closed, which may be referred to herein as "the position" of the valve, may be adjusted manually, or automatically, such as in response to signals received from the controller 22. The adjustment of the position of the valves 16, 18 may be carried out by means of mechanical, electrical, hydraulic, or pneumatic systems, or combinations thereof. In one embodiment, the valves 16, 18 may be substantially similar. For example, each of the valves 16, 18 may be configured such that their respective valve positions may be continuously adjustable between a fully open and a fully closed position (hereinafter, a "continuously adjustable control valve"). In another embodiment, the valves 16, 18 may of different construction. For example, the bypass control valve 16 may be a continuously adjustable control valve and the feed control valve 18 may be configured as a basic open/close valve. In a further embodiment, the system 2 may include a bypass control valve 16 only (i.e., the feed control valve 18 may be omitted).

In various embodiments, one or more heating elements (not shown) may be operatively associated with any or all of the components of the flow path 6, including the bypass and feed control valves 16, 18. The heating elements may be utilized to, for example, maintain the temperature of the conduits 6a, 6b, and 6c and/or valves 16, 18 at a temperature above a condensation point of a vapor being transported therethrough, thereby preventing condensation of the vapor on the walls of the conduits 6a, 6b, and 6c and/or valves 16, 18.

In some embodiments, the system 2 may include a controller 22 operatively coupled to one or more components of the system 2 such that one or more characteristics of a fluid flow within the fluid pathway 6 may be monitored and/or controlled. Generally, the controller 22 may be configured as one or more processing devices (e.g., general purpose computers, programmable logic controllers, combinations thereof) having instructions stored thereon for monitoring system variables and causing components of the system 2 to perform specified functions. For example, the controller 22 may be provided with instructions to, in response to signals received from one or more components of the system 2 (e.g., sensors) selectively actuate one or more components of the system 2 (e.g., valves) to achieve/maintain a desired process condition (e.g., flow rate, pressure setpoint) within the fluid pathway 6.

In various embodiments, as shown in FIG. 1, the controller 22 may be operatively coupled to any or all of the pressure sensor 14, the bypass control valve 16, and the feed control valve 18. In this embodiment, the controller 22 may be provided with instructions to, for example, receive signals from the pressure sensor 14 regarding a fluid pressure within the fluid pathway 6, compare the measured pressure to a predetermined pressure setpoint, and selectively actuate either or both of the bypass control valve 16 and the feed control valve 18 (e.g., set/change valve position) such that the pressure setpoint is achieved/maintained. In this manner, the system 2 may be configured to precisely control system pressures and flow rates, such as the pressures and flow rates of vapor entering the first vacuum chamber 8 and/or the second vacuum chamber 12. Consequently, and as will be discussed in further detail below, the system 2 may also be configured to compensate for any interruptions or perturbations in the rate of vapor supplied by the vapor source 4.

In various embodiments, the first vacuum chamber 8 may include any device configured to condense and collect a vapor flow under vacuum conditions. In this regard, the first vacuum chamber 8 may be operated at a temperature and pressure sufficient to condense any or all of the components of a vapor flow which is transported from the vapor source 4 to the first vacuum chamber 8. To achieve a vacuum pressure, the first vacuum chamber 8 may be operatively coupled to one or more vacuum sources, such as a vacuum pump 26. In one embodiment, the first vacuum chamber 8 may include a condenser having a collector disposed therein for collecting condensed vapor.

In illustrative embodiments, the second vacuum chamber 12 may include any device configured to condense, under vacuum conditions, at least a portion of a vapor flow introduced to the chamber 12 through the feed conduit 6c. To achieve a vacuum pressure, the second vacuum chamber 12 may be operatively coupled to one or more vacuum sources, such as a vacuum pump 28.

In one embodiment, the second vacuum chamber 12 may include a condensing chamber (e.g., a vacuum distillation chamber) that includes a collector for collecting condensed vapor and optionally an outlet for releasing any uncondensed vapor. In such an embodiment, the second vacuum chamber 12 may be operated under conditions (e.g., temperature and pressure) such that pressure within the vacuum chamber 12 is at or above the vapor pressure of one or more components of a vapor mixture that is being transported to the vacuum chamber 12 from the feed vapor conduit 6c. In this manner, one or more components of the vapor mixture may be condensed out of a vapor mixture and collected in a collector. In further embodiments, the conditions of the second vacuum chamber 12 (e.g., temperature and pressure) may be different than that of the first vacuum chamber 8. In this way, one or more first components of a vapor mixture being transported to the vacuum chamber 12 via the fluid pathway 6 may be condensed and collected in the vacuum chamber 12, and one or more second components, which differ from the first components, may be condensed and collected in the first vacuum chamber 8.

In another embodiment, and as depicted in FIG. 1, the second vacuum chamber 12 may include a vapor coater for depositing at least a portion of a vapor flow on a substrate. Generally, vapor coaters useful in the system 2 of the present disclosure may include a rotating process drum and a plurality of rollers configured for unwinding a substrate (e.g., a rolled web of material), passing the un-wound substrate over a surface of the process drum, and re-winding the substrate. Useful vapor coaters may also include a vapor nozzle, in fluid communication with a vapor source, configured to deposit (e.g., by condensation, CVD reaction, plasma deposition) a vapor onto a surface of the substrate as it is passed over a surface of the process drum.

As shown in FIG. 1, in one embodiment, a vapor coater for use in the system 2 may include a first roll 32 configured to direct a substrate 34 around a rotatable process drum 36, and a second roll 38 configured to re-wind the substrate. The vapor coater may further include one or more vapor nozzles 42 positioned proximate a surface 43 of the rotatable process drum 36. The vapor nozzles 42 may be configured to deposit/condense a vapor onto a surface of the substrate 34 as it is passed over the process drum 36. In this regard, the vapor nozzles 42 may be fluidically coupled to the fluid pathway 6, particularly, the vapor feed conduit 6c. The rotatable process drum 36 may be provided with a heat transfer fluid circulation such that at least the surface 43 is temperature controlled, thereby promoting condensation, reaction, and/or other form of deposition of vapor onto the substrate 34.

In some embodiments, the vapor coater may further include one or more curing sources 44. The curing sources 44 may be positioned within the vapor coater such that following vapor deposition/condensation, the substrate 34 may be exposed to a treatment delivered from the curing sources 44. Curing sources 44 useful in the systems of the present disclosure include one or more of, for example, heat sources, ultraviolet radiation sources, e-beam radiation sources, and plasma radiation sources.

In various embodiments, the vapor coater may, in addition to the one or more vapor coating processes, include other deposition processes. For example, sputtering may precede or follow one or more vapor depositing steps to deposit layers such as, for example, metals, metal oxides, metal nitrides, and ceramics. Metals suitable for deposit by sputtering include, for example, aluminum, nickel, silver, chrome, copper, and combinations thereof. Metal oxides suitable for deposit by sputtering include, for example, alumina, magnesia, silica, zirconia, and titania.

Suitable substrates 34 for use in the vapor coater described herein include flexible materials capable of roll-to-roll processing, such as paper, polymeric materials, metal foils, and combinations thereof. Suitable polymeric substrates include various polyolefins, e.g. polypropylene, various polyesters (e.g. polyethylene terephthalate, fluorene polyester), polymethylmethacrylate and other polymers such as polyethylene naphthalate, polyethersulphone, polyestercarbonate, polyetherimide, polyarylate, polyimide, vinyls, cellulose acetates, and fluoropolymers.

In an alternative embodiment, the substrate 34 is a discrete part rather than a continuous roll of film. The discrete part may move past the vapor nozzle 42, or the discrete part may be stationary during the coating process. Suitable discrete substrates include silicon wafers, electronic or optical devices, glass, metal, and plastic parts.

The present disclosure further relates to methods for processing vapor such as, for example, monitoring and controlling a flow of vapor generated by a vapor source. The methods for processing vapor may be carried out utilizing the system of FIG. 1.

In some embodiments, the methods of the present disclosure may include, during normal operation, discharging vapor from the vapor source 4 into the outlet conduit 6a at an initial vapor flow rate. The initial flow rate of the vapor may be substantially equivalent to a current vapor generation rate of the vapor source 4 (e.g., the vapor generated by the vapor source 4 may be vented to the outlet conduit 6a). The vapor flow may then be transported, at the initial rate, through the outlet conduit 6a towards the vapor bypass control valve 16 and the feed control valve 18. The controller 22, a its coupling to one or more pressure sensors (e.g. pressure sensor 14), may monitor the pressure of the vapor at a position within the fluid pathway 6. The positions of the bypass control valve 16 and the feed control valve 18 may be such that, at the initial vapor flow rate, a pressure within the fluid pathway 6 is at a predetermined pressure setpoint. Assuming the positions of the bypass control valve 16 and the feed control valve 18 are maintained (and constant temperature), at the initial vapor flow rate, the pressure setpoint may be maintained within the fluid pathway 6. Moreover, the flow rates of vapor through the fluid pathway 6, including the vapor bypass conduit 6b and the vapor feed conduit 6c, may be substantially maintained at an initial value.

The vapor generation rate of the vapor source 4 may fluctuate, thereby causing a momentary increase/decrease of the vapor flow rate and pressure within the outlet conduit 6a and, in turn, the bypass conduit 6b and the feed conduit 6c. The controller 22 may detect this variation in vapor flow conditions, for example, by signals received from the pressure sensor 14. Upon detection of the variation in flow conditions, the controller 22 may communicate instructions to either or both of the bypass control valve 16 and the feed control valve 18 to change their respective positions. Particularly, the controller 22 may effect modulation of the positions of either or both of the bypass control valve 16 and the feed control valve 18 such that the pressure and flow rate of vapor passing through the feed conduit 6c is maintained (and thus the pressure and flow rate of vapor passing through the bypass conduit 6b is varied), despite the variation in vapor flow supplied by the vapor source 4. The controller 22 may accomplish this by, for example, modulating the positions of either or both of the bypass control valve 16 and the feed control valve 18 such that the a pressure of the vapor at a position within the flow system 6 is maintained at the predetermined pressure set point. In this manner, the systems and methods of the present disclosure may allow for precise control of the pressure and flow rates of vapor passing through the bypass conduit 6b and the feed conduits 6c.

In some embodiments, the controller 22 may control the amounts and pressures of vapor passing through the fluid pathway 6, particularly, the bypass vapor and feed vapor conduits 6b, 6c, by modulating the position of the bypass control valve 16 only (and thus maintaining the feed control valve 18 in a fixed position). In such embodiments, upon the controller 22 detecting a variation in vapor flow conditions, the controller 22 may modulate the position of the bypass control valve 16 such that the flow rate and pressure of the vapor passing through feed vapor conduit 6c is maintained. The controller 22 may accomplish this by, for example, modulating the positions of the bypass control valve 16 such that the pressure of the vapor flow at a position within the flow system 6 (e.g., pressure in outlet conduit 6a) is maintained at a predetermined pressure set point. In embodiments in which vapor flow is controlled by modulation of the bypass control valve 16 only, the feed control valve 18 may be configured as an on/off valve or omitted.

In embodiments in which the second vacuum chamber 12 is a vapor coater, the methods of the present disclosure further include deposition of at least a portion of the vapor transported into the vacuum chamber 12 from the feed conduit 6c onto a substrate. Referring again to FIG. 1, the method may include unwinding the substrate 34 from the first roll 32 and onto the surface 43 of the process drum 36, such that the substrate 34 is in intimate contact with the drum surface 43. As the process drum 36 rotates, the substrate 32 may move past the vapor nozzle 42. The vapor nozzle 42 may project vapor, which is being supplied at a precisely controlled pressure and flow rate through the feed conduit 6c, onto the substrate 34 where it may deposited by, for example, condensation, CVD reaction, or plasma deposition. As the process drum 36 is further rotated, condensed fluid deposited on the substrate 34 may move past the curing source 44, which may apply a curing treatment to form a cured coating layer on the substrate. The coated substrate may then be re-wound on the second roll 38.

Utilizing the vapor monitoring and control methods of the present disclosure outlined above, the flow rate and pressure of the vapor being transported in the feed conduit 6c and, thus the deposition rate onto the substrate 34, may be precisely controlled irrespective of fluctuations or perturbations in the rate vapor is being supplied from the vapor source 4. Consequently, the vapor may be deposited onto the substrate 34 with very small variations in thickness over the length of the substrate 34. Moreover, by incorporating a bypass conduit 6b into the fluid pathway 6, flow of vapor to the vapor coater may be eliminated during start up and shut down phases of the vapor source 4, thereby reducing the amount of substrate wasted during the start up and shut down phases.

In embodiments in which the second vacuum chamber 12 is a condensing chamber, the methods of the present disclosure further include condensing at least a portion of the vapor transported into the vacuum chamber 12 from the feed conduit 6c. For example, the method may include operating the condensing chamber at a pressure that is above the vapor pressure of any or all of the components of the vapor being transported from the vapor feed conduit 6c, condensing at least a portion of the vapor, and collecting the condensed vapor in a collector.

In some embodiments, the vapor processing systems and methods of the present disclosure may be carried at pressures within the fluid pathway 6 as low as 1000 mTorr, 100 mTorr, 1 mTorr, 0.1 mTorr, or even as low as as 0.001 mTorr. Pressures within the fluid pathway 6 may be as high as 1 Torr, 10 Torr, 100 Torr, 500 Torr, or even as high as 760 Torr.

In various embodiments, the vapor processing systems and methods of the present disclosure may be carried at vapor flow rates as low as 1 g/min, 0.1 g/min or even as low as 0.001 g/min. The vapor flow rates may be as high as 100 g/min, 1 kg/min, or even as high as 50 kg/min. In one embodiment, the vapor flow rate ranges from 1-50 g/min.

In embodiments in which the second vacuum chamber 12 includes a vapor coater, the systems and methods of the present disclosure may be run at substrate line speeds as low as 10, 1, or even as low as 0.1 feet/minute (3.0, 0.3 or 0.03 m/min.). Substrate line speeds may be as high as 10, 100, or even as high as 2000 feet/minute (3.0, 30.5 or 609.6 m/min.). In one embodiment, the substrate line speed ranges from 10-300 feet/minute 3.0-304.8 m/min.).

In embodiments in which the second vacuum chamber 12 include a vapor coater, the systems and methods of the present disclosure may achieve coating thicknesses as low as 100, 10, or even as low as 0.1 nm. The coating thicknesses may be as high as 1, 25, or even as high as 50 µm. In one embodiment, the coating thicknesses may range from 0.1-10,000 nm, 1-5000 nm, or 10-1000 nm.

As previously discussed, the system and methods of the present disclosure allow for precise control of the pressures and flows of vapor entering the second vacuum chamber 12 and, thus in embodiments in which the second vacuum chamber 12 includes a vapor coater, precise control of the deposition rate of the vapor onto a substrate. Such precise control of deposition rate, in turn, allows for the deposition of coatings having very small variations in thickness over the length of the substrate (i.e, the longitudinal dimension of the substrate). In some embodiments, the systems and methods of the present disclosure may produce coated substrates having a variation in coating thickness of less than 20%, 5%, or even less than 1% over lengths of substrate as high as 10, 1000, or even as high as 10,000 feet.

The systems and methods of the present disclosure may be used to produce single or multi-layer films for applications such as optical films (reflectors, antireflection, absorbers, colored, optically variable, optical filters, optical interference filters, infrared reflectors), EMI (Electromagnetic Interference) filters, release coatings, transparent conductive films, capacitors, sensors, heat seal packaging, and display films. Examples of at least some of such films are described in the following patents and publications, incorporated by reference herein in their entireties: U.S. Pat. No. 5,018,048 (Shaw et al.); U.S. Pat. No. 5,811,183(Shaw et al.); U.S. Pat. No. 5,877, 895 (Shaw et al.); U.S. Pat. No. 6,172,810 (Fleming et al.); U.S. Pat. No. 6,815,043 (Fleming et al.); U.S. Pat. No. 6,818, 291 (Funkenbusch et al.); U.S. Pat. No. 6,929,864 (Fleming et al.); U.S. Pat. No. 6,357,880 (Epstein et al.); 2005/0037218 (Lottes et al.); U.S. Pat. No. 7,449,146 (Rakow et al.); U.S. Pub. No. 2006/0078700 (Blestos et al.) and 2003/0124392 (Bright).

The systems and methods of the present disclosure may further be used to produce coated substrates which, when combined with additional layers of, for example, metals or metal oxides, limit permeation of gases such as oxygen and water vapor. Such barrier films and processes for the preparation of barrier films may be found, for example in the following patents and publications, incorporated by reference herein in their entireties: U.S. Pat. No. 5,440,446 (Shaw, et al.); U.S. Pat. No. 5,725,909 (Shaw et al.); U.S. Pat. No. 6,231,939 (Shaw et al.); U.S. Pat. No. 6,420,003 (Shaw et al.); U.S. Pat. No. 4,647,818 (Ham); U.S. Pat. No. 4,696,719 (Bischoff); U.S. Pat. No. 4,842,893 (Yializis et al.); U.S. Pat. No. 4,954,371 (Yializis); U.S. Pat. No. 5,032,461 (Shaw et al.); U.S. Pub. 2002/0022156 (Bright), U.S. Pat. No. 7,018, 713 (Padiyath et al.), U.S. Pub. 2004/0202708 (Roehrig et al.), and U.S. Pub. 2005/0037218 (Lottes et al.). Such moisture and oxygen resistant barrier films are useful in the manufacture of many products, for example, as packaging for food and drugs and for the protection of environmentally sensitive electronic devices. Electronic devices that degrade when exposed to environmental moisture and oxygen are often protected from exposure by encasing the device in glass. A particularly useful application of barrier films made by the process disclosed herein includes protection for electronic display and signage devices, such as liquid crystal displays (LCDs), light emitting diodes (LEDs), organic light emitting diodes (OLEDs), light emitting polymers (LEPs), electrochromic, electrophoretic inks, inorganic electroluminescent devices, phosphorescent devices, and the like. Other useful applications for barrier films produce at least in part by the systems and methods of the present disclosure include the protection of solar cells, photovoltaics, micro-electronics, organic micro-electronic devices (OMED), nano-devices, and nano-structures. Still other useful applications for such barrier films include bio-active devices such as those used in analytical measurements of bio-active materials, bio-active-micro-electronic devices used for analysis or separations. In addition to providing a barrier to environmental moisture and oxygen, the barrier films may be flexible, making possible the production of flexible displays, electrical devices, and bio-active devices.

EXAMPLES

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

Examples 1-5

A coating precursor solution of difunctional acrylate monomer (SR833S from Sartomer) and 250 ppm of a polymerization inhibitor (as described generally in U.S. Pub. 2010/0168434, which is incorporated herein by reference in its entirety) was vaporized and coated at a coating width of 12.5 inches (318 mm) onto a substrate (2-mil (51 µm) PET, 14-inches (356 mm) wide) as follows.

The coating precursor solution was placed in a temperature controlled supply tank and preheated to a temperature of 100° C. The coating precursor solution was fed, using a liquid flow controller, from the supply tank to a vapor source, as generally described in the present disclosure, at a rate of 8.0 ml/min (it is believed that the type of vapor source does not have an appreciable impact on coating performance). The vapor source was vented to a fluid conduit that separated the vapor flow into 2 channels: a bypass conduit connected to a condenser (operated at −10° C.) and a feed conduit connected to a vapor nozzle of a vapor coater (configured similarly to the vapor coater described with respect to FIG. 1 of the present disclosure). A vapor control valve (Baumann 81000 Mikroseal Control Valve with FieldVUE DCV2000 Digital Valve Controller from Emerson Process Management) was provided in the bypass conduit, and a shut-off valve was provided in the feed conduit. The fluid conduit, including the bypass and feed conduits, shut-off valve, and vapor control valve were heated to 181° C. The pressure of the vapor flow was measured in the fluid conduit (upstream of the bypass and feed conduits) using an MKS Baratron capacitance manometer. The manometer supplied feedback into the vapor control valve for process control.

The coating precursor was discharged from the nozzle onto the substrate travelling at a constant line speed (16 feet per minute (4.9 m/min.)). The process drum temperature was maintained at 0° C. The substrate was subsequently passed under an electron beam operating at 9.0 kV and 4.0 mA to effect curing. The coating thickness was controlled using the vapor control valve to regulate the pressure of vapor in the fluid conduit. The vapor control valve was programmed to maintain a pressure setpoint in the fluid conduit, and different pressure setpoints were selected as listed in Table 1. The transmission and reflectance of the coating and the substrate were measured at a downstream location using an online optical spectrophotometer. Thickness was determined based upon the location of interference peak maxima and minima across the spectrum from 400 to 850 nm measured using the spectrophotomer.

TABLE 1

VAPOR PRESSURE AND COATING THICKNESS

| Example | Pressure Set Point (mtorr) | Mean Coating Thickness (nm) |
|---|---|---|
| 1 | 80 | 592 |
| 2 | 90 | 722 |
| 3 | 100 | 842 |
| 4 | 110 | 967 |
| 5 | 93 | 735 |

Figure 2:
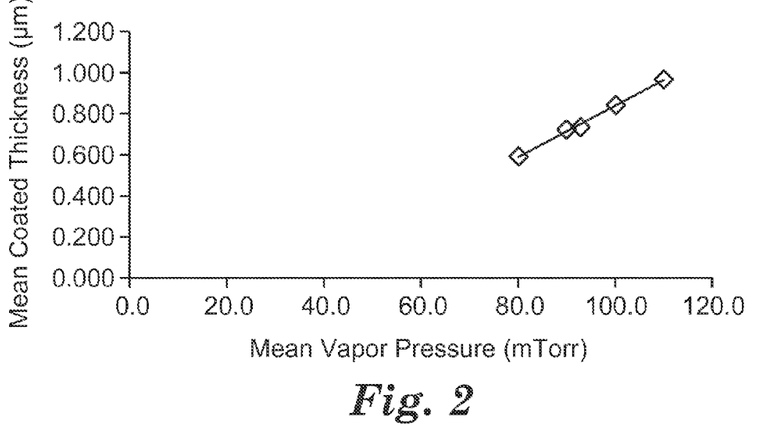
FIG. 2 is a plot of mean coated thickness as a function of mean vapor pressure, which was generated using systems and methods in accordance with some embodiments of the present disclosure.

FIG. 2 illustrates a plot of the mean coating thickness versus pressure set point observed in Examples 1-5. A linear relationship between the vapor pressure and the coating thickness was observed:

$$\text{Thickness(microns)} = 0.0125 * (\text{Vapor Pressure}) - 0.4118$$
$$(R^2 = 0.9959)$$

Example 6

A coating precursor solution of difunctional acrylate monomer (SR833S) and 250 ppm of a polymerization inhibitor was vaporized and coated at a coating width of 12.5 inches (318 mm) onto a substrate (2-mil (51 μm) PET, 14-inches (356 mm) wide) as in Examples 1-5, except that: 4 wt % of N-n-Butyl-Aza-2,2-Dimethoxysilacyclopentane (Gelest) was added to the precursor formulation; the electron beam was operated at 7.0 kV and 3.0 mA; and the vapor control valve was operated to maintain the pressure at 95 mtorr.

Figure 3:
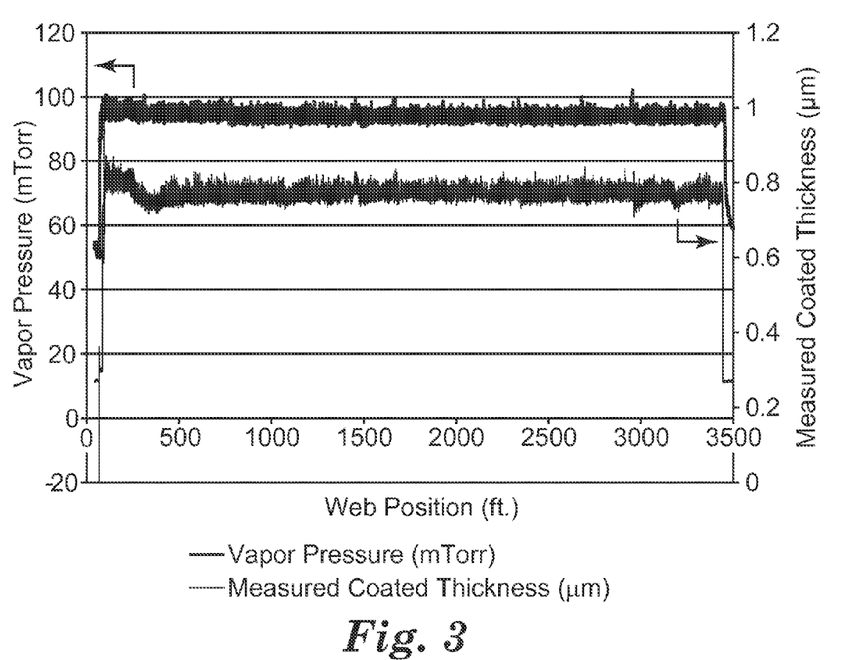
FIG. 3 is a plot of both vapor pressure and measured coated thickness, as a function of substrate web position, which was generated using systems and methods in accordance with some embodiments of the present disclosure.

FIG. 3 is a plot of both vapor pressure and measured coated thickness, as a function of substrate web position in a longitudinal, or down-web direction, observed in Example 6. The mean thickness was 771 nm with a standard deviation of 14.8 nm. The coefficient of variance (COV) was 0.019, substantially less than the COV of the liquid flowrate into the vapor source (liquid flowrate mean 7.90 ml/min, standard deviation 0.334 ml/min, COV 0.042). This demonstrates that the vapor control valve substantially reduced the variation in the coating thickness relative to the variation in the input flow rate of the liquid.

Other embodiments of the invention are within the scope of the appended claims.

What is claimed is:

1. A vapor processing system comprising:
a vapor source for producing a vapor;
an outlet conduit connected to the vapor source for carrying the vapor from the vapor source, wherein downstream of the vapor source the outlet conduit separates into a vapor bypass conduit and a vapor feed conduit;
a first vapor control valve disposed in the vapor bypass conduit;
a first vacuum chamber connected to the vapor bypass conduit, and disposed downstream of the first vapor control valve;
a second vacuum chamber connected to the vapor feed conduit;
a controller operatively coupled to the first vapor control valve, wherein the controller is configured to control, via the first vapor control valve, the flow of vapor to the first vacuum chamber; and
a pressure sensor operatively coupled to the controller and positioned to
sense a pressure in the outlet conduit or the vapor feed conduit,
wherein the controller is further configured to vary the position of the first vapor control valve based at least in part on pressure sensed by the pressure sensor so as to control the flow of vapor to the first vacuum chamber and the flow of vapor to the second vacuum chamber.

2. The system of claim 1, further comprising a second vapor control valve located in the feed conduit upstream of the second vacuum chamber and operatively coupled to the controller, and wherein the controller is configured to control the flow of vapor through either or both of the first and second vapor control valves.

3. The system of claim 1, further comprising a second vapor control valve located in the feed conduit upstream of the second vacuum chamber of the type that is configured to be normally either fully open or fully closed.

4. The system of claim 1, wherein the second vacuum chamber comprises a vapor coater for depositing at least a portion of the vapor on a substrate.

5. The system of claim 4, wherein the substrate is a web of material and the vapor coater comprises:
within the second vacuum chamber a rotating drum having a temperature-controlled surface around which the substrate web is moved;
a vapor dispensing nozzle connected to the vapor feed conduit, and disposed proximate the temperature-controlled surface of the rotating drum; and
a plurality of rollers configured for unwinding the substrate web, passing it around the temperature-controlled surface of the drum and rewinding the web.

6. The system of claim 5, wherein the vapor coater further comprises a curing source configured to expose the substrate web to a treatment delivered from the curing source for initiating polymerization of a liquid monomer or oligomer deposited from the vapor onto a surface of the substrate, and wherein the treatment comprises one or more of the group consisting of ultraviolet radiation electron beam radiation, a plasma radiation, and heat.

7. The system of claim 5 in which the second vacuum chamber further comprises a condensing chamber for condensing at least a portion of the vapor, the vacuum condensing chamber comprising a collector for collecting condensed vapor.

8. The system of claim 4 in which the first vacuum chamber comprises a condenser, the condenser comprising a collector for collecting condensed vapor.

9. The system of claim 4 in which the first vacuum chamber is operated at a temperature and/or pressure that is different than an operating temperature and/or pressure of the second vacuum chamber.

10. The system of claim 4 in which the vapor comprises one or more materials selected from the group consisting of epoxies, vinyl ethers, (meth)acrylates, fluoro-containing polymers, styrene containing polymers, acetylenes, polyamides, acrylamides, parylenes, waxes, fluoropolyethers, polyamines, diallyldiphenylsilanes, metal alkoxides, metal alkyls, silicones, oils, dyes, proteins, peptides, polypeptides, lipids, carbohydrates, enzymes, nucleic acids, polynucleic acids, drugs, drug metabolites, and combinations thereof.

11. The system of claim 1, wherein the controller controls, via the first vapor control valve, the flow of vapor to the first vacuum chamber such that the flow rate and pressure of the vapor passing through the vapor feed conduit is maintained upon detection of variation in vapor flow conditions.

* * * * *